(12) United States Patent
Hu

(10) Patent No.: US 11,322,715 B2
(45) Date of Patent: May 3, 2022

(54) DISPLAY MODULE INCLUDING STACKED OLED PANELS AND MANUFACTURING METHOD AND ELECTRONIC DEVICE THEREOF

(71) Applicant: Wuhan China Star Optoelectronics Semiconductor Display Technology Co., Ltd., Wuhan (CN)

(72) Inventor: Jian Hu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/495,290

(22) PCT Filed: Apr. 12, 2019

(86) PCT No.: PCT/CN2019/082536
§ 371 (c)(1),
(2) Date: Sep. 18, 2019

(87) PCT Pub. No.: WO2020/155397
PCT Pub. Date: Aug. 6, 2020

(65) Prior Publication Data
US 2021/0367191 A1 Nov. 25, 2021

(30) Foreign Application Priority Data
Jan. 31, 2019 (CN) .......................... 201910098519.0

(51) Int. Cl.
*H01L 51/52* (2006.01)
*H01L 51/56* (2006.01)

(52) U.S. Cl.
CPC .......... *H01L 51/5246* (2013.01); *H01L 51/56* (2013.01)

(58) Field of Classification Search
CPC ... H01L 51/5246; H01L 51/56; H04N 13/388; H04N 13/395
USPC ......................................................... 257/40
See application file for complete search history.

(56) References Cited

U.S. PATENT DOCUMENTS

| | | | |
|---|---|---|---|
| 2002/0071179 A1 | 6/2002 | Maeda et al. | |
| 2004/0150584 A1* | 8/2004 | Chuman | H04N 13/395 345/6 |
| 2004/0245541 A1* | 12/2004 | Shitagaki | H05B 33/04 257/103 |
| 2017/0084213 A1 | 3/2017 | Yang et al. | |
| 2017/0276979 A1* | 9/2017 | Li | H01L 51/4206 |

FOREIGN PATENT DOCUMENTS

| | | |
|---|---|---|
| CN | 202331409 U | 7/2012 |
| CN | 105093553 A | 11/2015 |
| CN | 107018214 A | 8/2017 |

(Continued)

*Primary Examiner* — Matthew E. Gordon

(57) ABSTRACT

A display module and manufacturing method and electronic device thereof are provided. The manufacturing method includes forming a first bonding layer on a side of a first display panel; bonding a second display panel on a side of the first display panel where the first bonding layer is formed; forming a second bonding layer on a side of the first display panel or the second display panel away from the first bonding layer; and forming a covering layer on a side of the first display panel or the second display panel away from the first bonding layer.

17 Claims, 5 Drawing Sheets

(56) References Cited

FOREIGN PATENT DOCUMENTS

| CN | 108819433 A | 11/2018 |
| CN | 208060902 U | 11/2018 |
| CN | 109065579 A | 12/2018 |

* cited by examiner

DISPLAY MODULE INCLUDING STACKED OLED PANELS AND MANUFACTURING METHOD AND ELECTRONIC DEVICE THEREOF

FIELD OF INVENTION

Field of Invention

The present disclosure relates to the display field, and particularly to a display module and manufacturing method and electronic device thereof.

Background of Invention

The theory of present imaging technology: When people's eyes watch an object, because the angles watched by the two eyes are different, the images formed are not exactly the same. Therefore, the two images synthesized by the brain can be distinguished front and rear or far and close, so that a three-dimensional feeling is generated. The present three-dimensional movies are based on such an imaging theory. They use two cameras to simulate people's two eyes, and the two cameras are set to play synchronously that can make the audiences get the three-dimensional feeling.

However, the imaging technology have many restrictions and defects such as the long playing distance. This defect causes the requirement for a large space and is unable to be popularized in the utilization of mobile phones and pads; consumption of the electricity: because of the requirement of two projectors, the power consumption will increase in double compared with the 2D one; the requirement of two projectors playing at the same time is high, and the cost is also high.

Therefore, now a display is intensively required to solve problems mentioned above.

SUMMARY OF INVENTION

The present disclosure provides a display module and manufacturing method and electronic device thereof to solve the problems of the higher cost and the bad experience of the present 3D imaging technology.

To overcome the problems above, the present disclosure provides the technical solutions as follows:

The present disclosure provides a manufacturing method of a display module which includes:
  providing a first display panel;
  forming a first bonding layer on a side of the first display panel;
  providing a second display panel, applying a first device to bond the second display panel on the side of the first display panel where the first bonding layer is formed;
  forming a second bonding layer on a side of the first display panel or the second display panel which is away from the first bonding layer; and
  forming a covering layer on a side the first display panel or the second display panel which is away from the first bonding layer.

In the manufacturing method of the present disclosure, after forming the first bonding layer the method includes a step:
  applying a second device to perform a defoaming process on the side of the first display panel where the first bonding layer is formed;
  wherein after forming the second bonding layer the method includes a step:
  applying the second device to perform a defoaming process on the first display panel and the second display panel where the second bonding layer is formed.

In the manufacturing method of the present disclosure, material of the first bonding layer and the second bonding layer is optical clear adhesive.

In the manufacturing method of the present disclosure, the first bonding layer is located between the first display panel and the second display panel, the second bonding layer is located on the side of the second display panel which is away from the first bonding layer, and the covering layer is located on the first display panel;
  wherein an area of the first display panel is smaller than an area of the second display panel.

In the manufacturing method of the present disclosure, the first bonding layer is located between the first display panel and the second display panel, the second bonding layer is located on the side of the first display panel which is away from the first bonding layer, and the covering layer is located on the second display panel; and
  wherein an area of the first display panel is larger than an area of the second display panel.

In the manufacturing method of the present disclosure, after forming a covering layer on a side the first display panel or the second display panel which is away from the first bonding layer, the method includes a step:
  applying ultraviolet to perform a curing process on the display module.

In the manufacturing method of the present disclosure, a bonding accuracy of the first display panel and the second display panel is 0.1±0.05 mm.

The present disclosure further provides a display module which includes:
  a first display panel;
  a second display panel which is located on the first display panel;
  a covering layer which is located on the second display panel; and
  wherein an area of the first display panel is smaller than an area of the second display panel.

In the display module of the present disclosure, the display module further includes a first bonding layer which is located on the first display panel and is away from a side of the second display panel, and a second bonding layer which is located between the first display panel and the second display panel.

In the display module of the present disclosure, material of the first bonding layer and the second bonding layer is optical clear adhesive.

In the display module of the present disclosure, the first display panel and the second display panel are organic light emitting diode display panels.

In the display module of the present disclosure, a bonding accuracy of the first display panel and the second display panel is 0.1±0.05 mm.

The present disclosure further provides an electronic device, including display module, wherein,
  the display module includes:
  a first display panel;
  a second display panel which is on the first display panel;
  a covering layer which is located on the second display panel; and
  wherein an area of the first display panel is smaller than an area of the second display panel.

In the electronic device of the present disclosure, the display module further includes a first bonding layer which is located on the first display panel and is away from a side of the second display panel, and a second bonding layer which is located between the first display panel and the second display panel.

In the electronic device of the present disclosure, material of the first bonding layer and the second bonding layer is optical clear adhesive.

In the electronic device of the present disclosure, the first display panel and the second display panel are organic light emitting diode display panels.

In the electronic device of the present disclosure, a bonding accuracy of the first display panel and the second display panel is 0.1±0.05 mm.

Beneficial Effects: through disposing two OLED display panels overlaid on each other and controlling the bonding space between the two display panels, the present disclosure realizes a 3D display which enables the users not necessary to wear 3D glasses, lowers the difficulty of the technology, reduces the cost, promotes the users' experience, omits a backlight unit, and reduces a thickness of the product.

DESCRIPTION OF DRAWINGS

To more clearly illustrate embodiments or the technical solutions of the present disclosure, the accompanying figures of the present disclosure required for illustrating embodiments or the technical solutions of the present disclosure will be described in brief. Obviously, the accompanying figures described below are only part of the embodiments of the present disclosure, from which figures those skilled in the art can derive further figures without making any inventive efforts.

DETAILED DESCRIPTION OF PREFERRED EMBODIMENTS

The descriptions of embodiments below refer to accompanying drawings in order to illustrate certain embodiments which the present disclosure can implement. The directional terms of which the present disclosure mentions, for example, "top," "bottom," "upper," "lower," "front," "rear," "left," "right," "inside," "outside," "side," etc., are just refer to directions of the accompanying figures. Therefore, the used directional terms are for illustrating and understanding the present disclosure, but not for limiting the present disclosure. In the figures, units with similar structures are used same labels to indicate.

Figure 1:
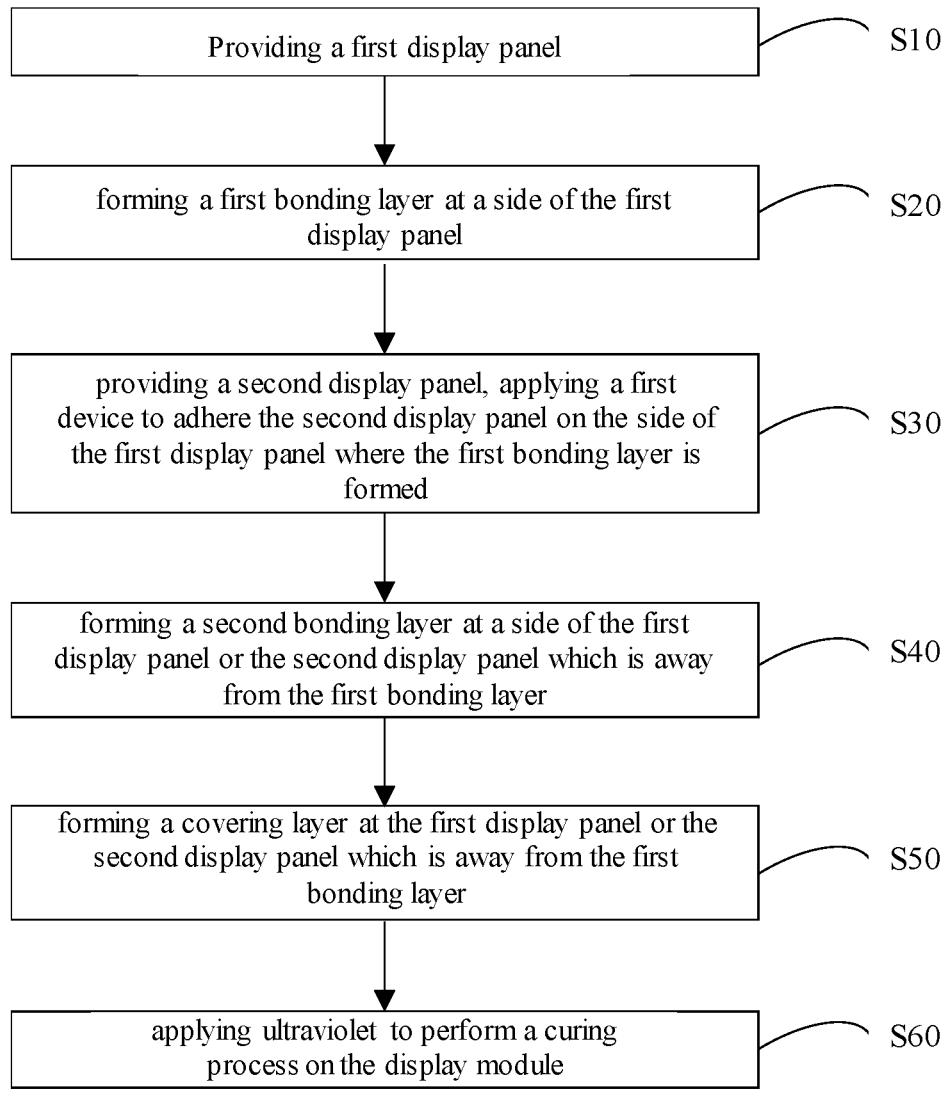
FIG. 1 is the process diagram of the manufacturing method of the display module of the present disclosure.

Please refer to FIG. 1; FIG. 1 is the process diagram of the manufacturing method of the display module of the present disclosure.

Please refer to FIGS. 2A-2D; FIGS. 2A-2D are related to diagrams showing different steps of the method for manufacturing the display module in accordance with a first embodiment of the present disclosure.

Please refer to FIGS. 3A-3D; FIGS. 3A-3D are related to diagrams showing different steps of the method for manufacturing the display module in accordance with a second embodiment the present disclosure.

The manufacturing method of the display module includes:

S10: providing a first display panel.

In the step, the first display panel is an organic light emitting diode display panel.

The first display panel 10 includes a first substrate 101, a first thin film transistor layer 102 which is located on the first substrate 101, a first light emitting layer 103 which is located on the first thin film transistor layer 102, a first packaging layer 104 which is located on the first light emitting layer 103.

In an embodiment, the first substrate 101 is a flexible substrate. The material of the flexible substrate 101 can be Polyimide (PI).

S20: forming a first bonding layer on a side of the first display panel 10.

In the step, a first bonding machine is mainly utilized to form a first bonding layer 30 on a side of the first display panel 10.

Figure 2A:
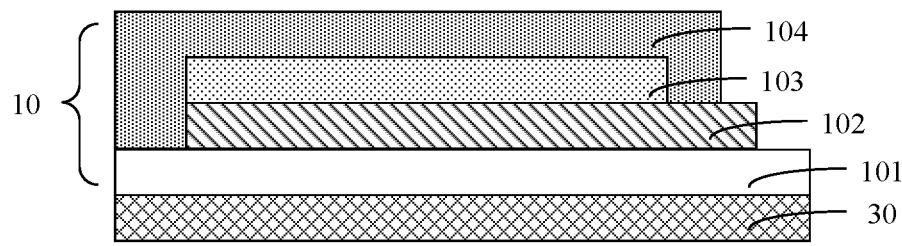
FIGS. 2A-2D are related to diagrams showing different steps of the manufacturing method of a first embodiment of the present disclosure.

Please refer to FIG. 2A; the first bonding layer 30 is formed on a side of the first substrate 101 which is away from the first thin film transistor. Please refer to FIG. 3A; the first bonding layer 30 is formed on the first packaging layer 104.

Because it is easy to form air bubbles and the protruding objects when forming the first bonding layer 30, wherein the protruding objects are easy to cause the panel to be scratched or have a poor panel display effect, after forming the first bonding layer 30, the method further includes a step:

Applying a first device to perform a defoaming process on the first display panel 10 where the first bonding layer 30 is formed. Breaking up the air bubbles which are generated during the bonding process to reduce internal stress by a second device.

In an embodiment, material of the first bonding layer 30 is optical clear adhesive.

S30: providing a second display panel 20, applying a first device to adhere the second display panel 20 on the side of the first display panel 10 where the first bonding layer is formed.

In the step, a second bonding machine is mainly utilized to bond the second display panel 20 and the first display panel 10 together through the first bonding layer 30.

In an embodiment, the first display panel 10 is an organic light emitting diode display panel.

In an embodiment, the second display panel 20 includes a second substrate 201, a second thin film transistor layer 202 which is located on the second substrate 201, a second light emitting layer 203 which is located on the second thin film transistor layer 202, a second packaging layer 204 which is located on the second light emitting layer 203.

In an embodiment, the second substrate 201 is a flexible substrate. The material of the flexible substrate can be polyimide (PI).

Figure 2B:
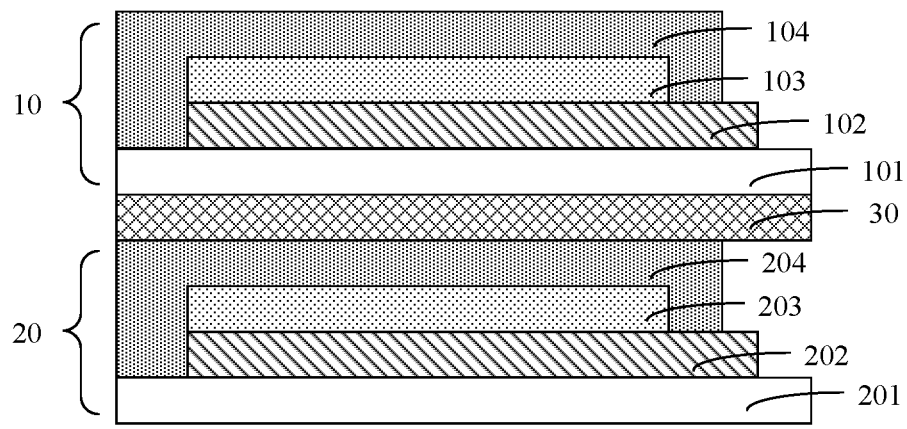

Please refer to FIG. 2B; the first bonding layer 30 is located between the second packaging layer 204 of the second display panel 20 and the first substrate 101. On the vertical direction, because the second display panel 20 is located under the first display panel 10, based on the consideration of the bonding accuracy, an area of the first display panel 10 is smaller than an area of the second display panel 20.

In an embodiment, each side of the second display panel 20 has a length which is 0.1 mm longer than a length of a corresponding side of the first display panel 10. A bonding accuracy of the first display panel 10 and the second display panel 20 is 0.1±0.05 mm.

Figure 3A:
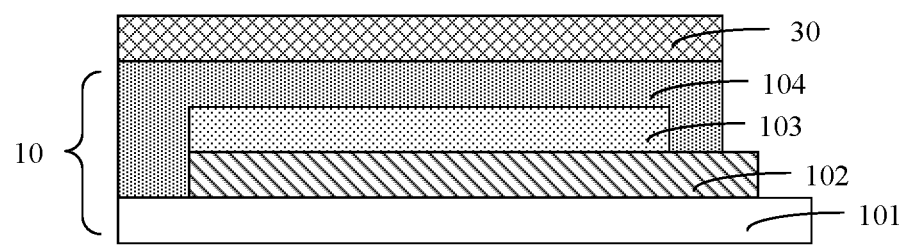
FIGS. 3A-3D are related to diagrams showing different steps of the manufacturing method of a second embodiment of the present disclosure.
Figure 3B:
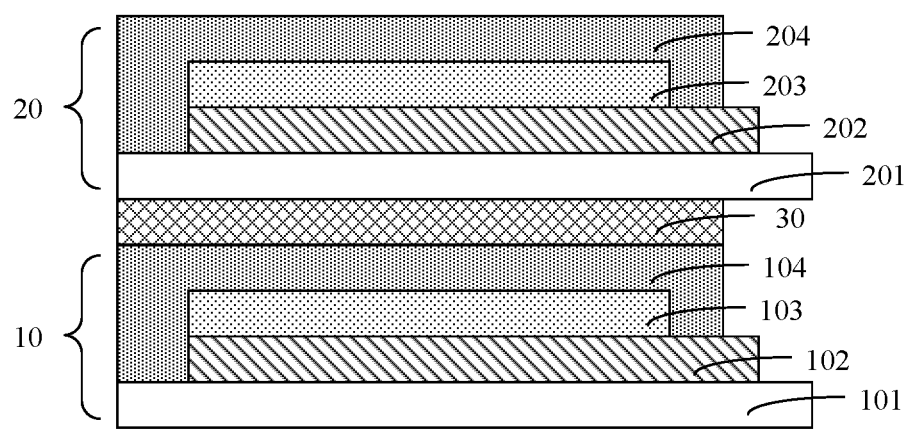
Figure 3C:
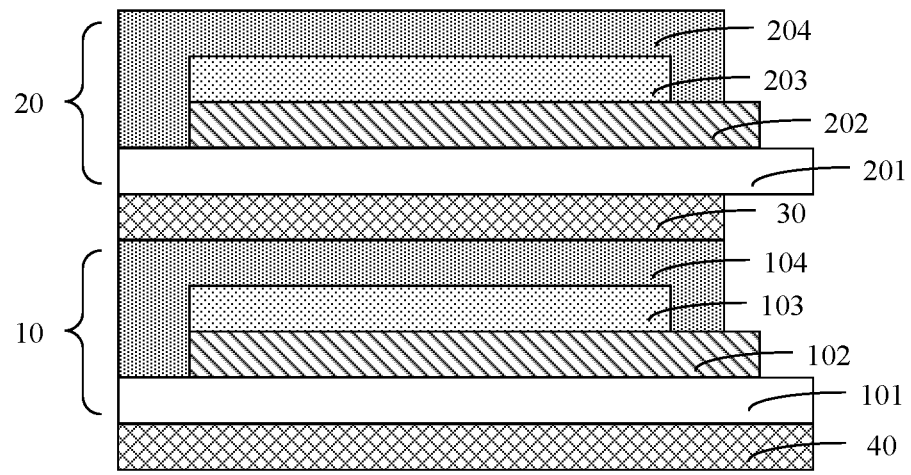

Please refer to FIG. 3B; the first bonding layer 30 is located between the second substrate 201 and the first packaging layer 104. On the vertical direction, because the second display panel 20 is located on the first display panel 10, based on the consideration of a bonding accuracy, an area of the first display panel 10 is larger than an area of the second display panel 20.

In an embodiment, each side of the second display panel 20 has a length which is 0.1 mm shorter a length of a corresponding side of the first display panel 10. A bonding accuracy of the first display panel 10 and the second display panel 20 is 0.1±0.05 mm.

S40: forming a second bonding layer 40 on a side of the first display panel 10 or the second display panel 20 which is away from the first bonding layer 30.

In the step, a first bonding machine is mainly utilized to form the second bonding layer 40 on a side of the first display panel 10 or the second display panel 20.

Figure 2C:
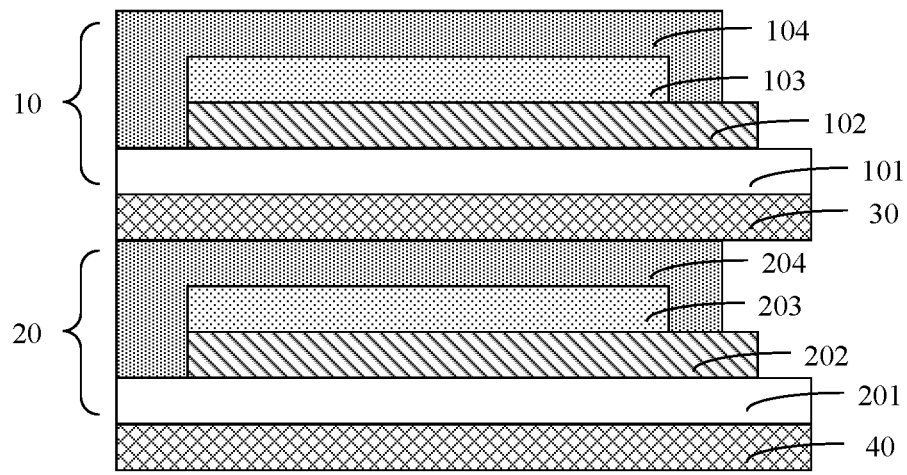

Please refer to FIG. 2C; the second bonding layer 40 is formed on the side of the second substrate 201 which is away from the second thin film transistor. Please refer to FIG. 3C; the second bonding layer 40 is formed on the side of the first substrate 101 which is away from the first thin film transistor.

Same as the step S20, it is easy to form air bubbles and the protruding objects when forming the first bonding layer 30. Therefore, after forming the first bonding layer 30, the method further includes a step:

Applying the second device to perform a defoaming process on the first display panel 10 and the second display panel 10 where the second bonding layer 40 is formed. Breaking up the air bubbles which are generated during the bonding process to reduce the internal stress by the second device.

In an embodiment, material of the second bonding layer 40 is optical clear adhesive.

Because the area of the packaging layer is smaller than the area of the substrate, when forming the bonding layer, a size of the area of the bonding layer is related to a size of the area of the corresponding bonding surface.

Please refer to FIG. 2C; an area of the first bonding layer 30 is equal to an area of the second bonding layer 40. Please refer to FIG. 3C, an area of the first bonding layer 30 is smaller an area of the second bonding layer 40.

S50: forming a covering layer 50 on a side of the first display panel 10 or the second display panel 20 which is away from the first bonding layer 30.

In the step, the second bonding machine is mainly utilized to form the covering layer 50 on the side of the first display panel 10 or the second display panel 20 which is away from the first bonding layer 30.

Figure 2D:
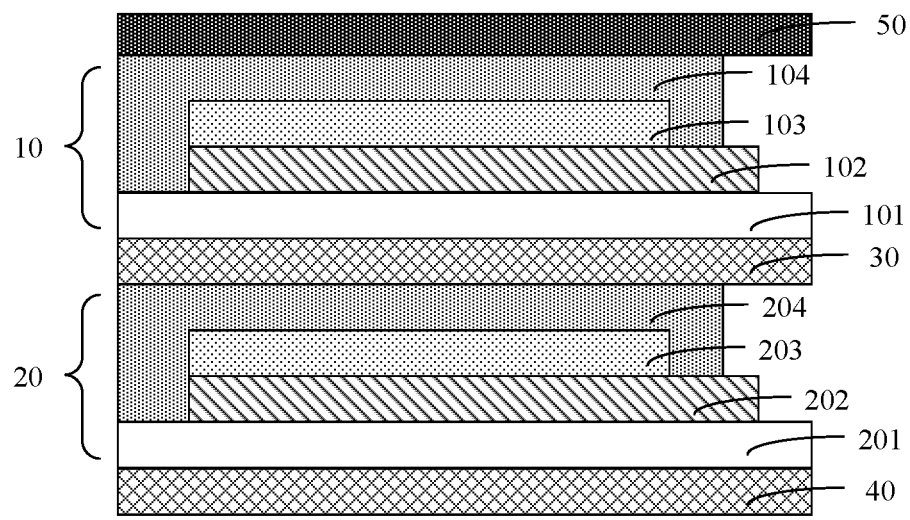

Please refer to FIG. 2D, the covering layer 50 is formed on the first packaging layer 104.

Figure 3D:
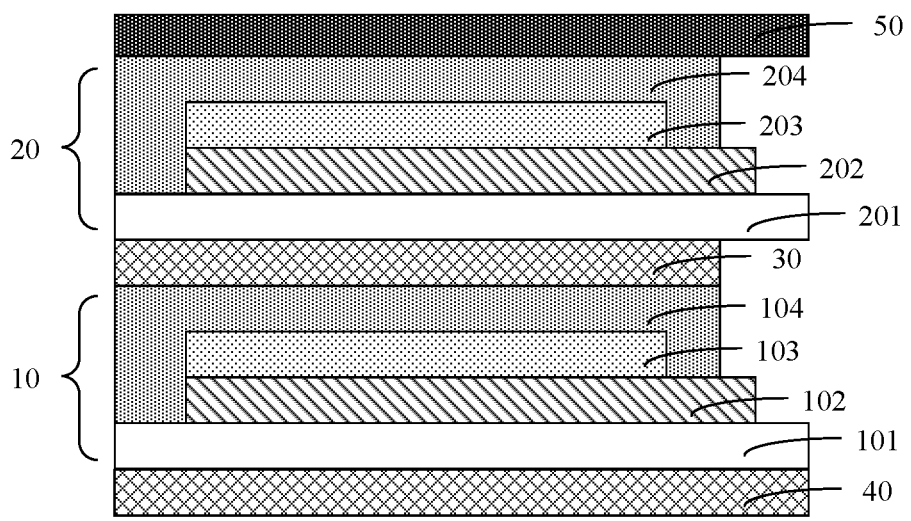

Please refer to FIG. 3D, the covering layer 50 is formed on the second packaging layer 204.

S60: applying ultraviolet to perform a curing process on the display module.

In the step, because the first bonding layer 30 and the second bonding layer 40 are optical clear adhesive, the optical clear adhesive is cured through the irradiation of ultraviolet, thereby making the bonding between the first display panel 10 and the second display panel 20 being more reliable.

Through disposing two OLED displays overlaid and controlling the bonding space between the two display panels, the present disclosure realizes a 3D display, enables the users not necessary to wear 3D glasses, lowers the difficulty of the technology, reduces cost, promotes users' experience, omits a backlight unit, and reduces a thickness of product.

Figure 4:
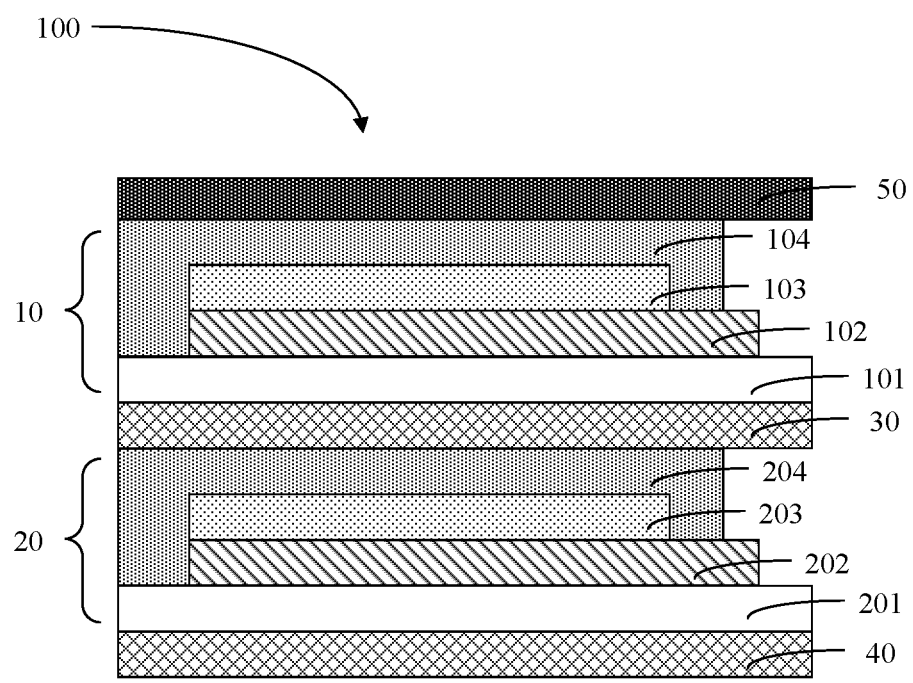
FIG. 4 is the membrane layer structure diagram of the present disclosure.

Please refer to FIG. 4; FIG. 4 is the membrane layer structure of the present disclosure.

The display module 100 includes:

A first display panel 10. In an embodiment, the first display panel 10 is an organic light emitting diode display panel.

The first display panel 10 includes a first substrate 101, a first thin film transistor layer 102 which is located on the first substrate 101, a first light emitting layer 103 which is located on the first thin film transistor layer 102, a first packaging layer 104 which is located on the first light emitting layer 103.

In an embodiment, the first substrate 101 can be a flexible substrate. The material of the flexible substrate 101 can be polyimide (PI).

The second display panel 20 which is located on the first display panel 10.

In an embodiment, the second display panel 20 is an organic light emitting diode display panel.

In an embodiment, the second display panel 20 includes a second substrate 201, a second thin film transistor layer 202 which is located on the second substrate 201, a second light emitting layer 203 which is located on the second thin film transistor layer 202, a second packaging layer 204 which is located on the second light emitting layer 203.

In an embodiment, the second substrate 201 is a flexible substrate. The material of the flexible substrate can be Polyimide (PI).

A covering layer which is located on the second display panel 20.

Please refer to FIG. 4; the display module 100 further includes a first bonding layer 30 which is at the first display panel 10 and is away from a side of the second display panel 20, and a second bonding layer 40 which is between the first display panel 10 and the second display panel 20.

In an embodiment, material of the first bonding layer 30 and the second bonding layer 40 is optical clear adhesive.

The first bonding layer 30 and the second bonding layer 40 are bonded on the first display panel 10 and the second display panel 20 through a first bonding machine. The second display panel 20 and the first display panel 10 are performed the corresponding bonding process through the second bonding machine.

It is easy to form air bubbles and the protruding objects when forming the first bonding layer 30 and the second bonding layer 40. The protruding objects are easy to cause the panel to be scratched or have a poor panel display effect, after forming the first bonding layer 30 and the second bonding layer 40, it also needs to perform a defoaming process on the display panel which are formed the first bonding layer 30 and the second bonding layer 40. Breaking up the air bubbles which are generated during the bonding process to reduce the internal stress by the first bonding machine.

In an embodiment, according to the difference of the sequence for bonding the display panels, the sizes of the first display panel 10 and the second display panel 20 are different. Please refer to FIG. 4; in this embodiment, the first display panel 10 is located on the second display panel 20, an area of the first display panel 10 is smaller than an area of the second display panel 20.

In an embodiment, each side of the second display panel 20 has a length which 0.1 mm longer than a length of a corresponding side of the first display panel 10. A bonding accuracy of the first display panel 10 and the second display panel 20 is 0.1±0.05 mm.

One aspect of the present disclosure, the present disclosure further provides an electronic device, the electronic device further includes the display module 100. The electronic device includes but not limits to mobile phones, tablet PCs, computer monitors, game consoles, televisions, display screens, wearable devices and other life electrics or home appliances, etc. with display capability.

The working theory of the electronic device is similar to the working theory of the display module 100, and the working theory of the electronic device can refer to the working theory of the module and will not give unnecessary details herein.

The present disclosure provides a display module and manufacturing method and electronic device thereof, which includes providing the first display panel; forming the first bonding layer on a side of the first display panel; providing the second display panel, and bonding the second display panel on the side of the first display panel where the first bonding layer is formed; forming the second bonding layer on a side of the first display panel or the second display panel which is away from the first bonding layer; forming the covering layer on a side the first display panel or the second display panel which is away from the first bonding layer. Through disposing two OLED displays overlaid and controlling the bonding space between the two display panels, the present disclosure realizes a 3D display and enables the users not necessary to wear 3D glasses, lowers the difficulty of the technology, reduces cost, promotes users' experience, omits a backlight unit, and reduces a thickness of product.

In summary, although the present disclosure has disclosed the preferred embodiments as above, however the above-mentioned preferred embodiments are not to limit to the present disclosure. A person skilled in the art can make any change and modification, therefore the scope of protection of the present disclosure is subject to the scope defined by the claims.

What is claimed is:

1. A manufacturing method of a display module, comprising:
   providing a first display panel;
   forming a first bonding layer on a side of the first display panel;
   providing a second display panel, applying a first device to bond the second display panel on the side of the first display panel where the first bonding layer is formed;
   forming a second bonding layer on a side of the first display panel or the second display panel away from the first bonding layer; and
   forming a covering layer on a side of the first display panel or the second display panel away from the first bonding layer,
   wherein the first display panel comprises a first packaging layer, the first packaging layer completely covers a light emitting layer of the first display panel and partially exposes a first thin film transistor layer of the first display panel, and
   wherein the second display panel comprises a second packaging layer that completely covers a second light emitting layer of the second display panel and partially exposes a second thin film transistor layer of the second display panel.

2. The manufacturing method of a display module as claimed in claim 1, wherein after forming the first bonding layer the method comprises a step:
   applying a second device to perform a defoaming process on the side of the first display panel where the first bonding layer is formed;
   wherein after forming the second bonding layer the method comprises a step:
   applying the second device to perform a defoaming process on the first display panel and the second display panel where the second bonding layer is formed.

3. The manufacturing method of a display module as claimed in claim 1, wherein material of the first bonding layer and the second bonding layer is optical clear adhesive.

4. The manufacturing method of a display module as claimed in claim 1, wherein the first bonding layer is located between the first display panel and the second display panel, the second bonding layer is located on the side of the second display panel which is away from the first bonding layer, and the covering layer is located on the first display panel;
   wherein an area of the first display panel is smaller than an area of the second display panel.

5. The manufacturing method of a display module as claimed in claim 1, wherein the first bonding layer is located between the first display panel and the second display panel, the second bonding layer is located on the side of the first display panel which is away from the first bonding layer, and the covering layer is located on the second display panel; and
   wherein an area of the first display panel is larger than an area of the second display panel.

6. The manufacturing method of a display module as claimed in claim 1, wherein after forming a covering layer on the side of the first display panel or the second display panel away from the first bonding layer, the method further comprises a step:
   applying ultraviolet to perform a curing process on the display module.

7. The manufacturing method of a display module as claimed in claim 1, wherein a bonding accuracy of the first display panel and the second display panel is 0.1±0.05 mm.

8. A display module, comprising:
   a first display panel, wherein the first display panel comprises a first packaging layer, the first packaging layer completely covers a light emitting layer of the first display panel and partially exposes a first thin film transistor layer of the first display panel;
   a second display panel located on the first display panel, wherein the second display panel comprises a second packaging layer that completely covers a second light emitting layer of the second display panel and partially exposes a second thin film transistor layer of the second display panel;
   a covering layer located on the second display panel; and
   wherein an area of the first display panel is smaller than an area of the second display panel.

9. The display module as claimed in claim 8, wherein the display module further comprises a first bonding layer which is located on the first display panel and is away from a side of the second display panel, and a second bonding layer which is located between the first display panel and the second display panel.

10. The display module as claimed in claim 8, wherein material of the first bonding layer and the second bonding layer is optical clear adhesive.

11. The display module as claimed in claim 8, wherein the first display panel and the second display panel are organic light emitting diode display panels.

12. The display module as claimed in claim 8, wherein a bonding accuracy of the first display panel and the second display panel is 0.1±0.05 mm.

13. An electronic device, comprising a display module, wherein the display module comprises:
- a first display panel, wherein the first display panel comprises a first packaging layer, the first packaging layer completely covers a light emitting layer of the first display panel and partially exposes a first thin film transistor layer of the first display panel;
- a second display panel located on the first display panel, wherein the second display panel comprises a second packaging layer that completely covers a second light emitting layer of the second display panel and partially exposes a second thin film transistor layer of the second display panel;
- a covering layer located on the second display panel; and wherein an area of the first display panel is smaller than an area of the second display panel.

14. The electronic device as claimed in claim 13, wherein the display module further comprises a first bonding layer which is located on the first display panel and is away from a side of the second display panel, and a second bonding layer which is located between the first display panel and the second display panel.

15. The electronic device as claimed in claim 13, wherein material of the first bonding layer and the second bonding layer is optical clear adhesive.

16. The electronic device as claimed in claim 13, wherein the first display panel and the second display panel are organic light emitting diode display panels.

17. The electronic device as claimed in claim 13, wherein a bonding accuracy of the first display panel and the second display panel is 0.1±0.05 mm.

\* \* \* \* \*